(12) United States Patent
Jain et al.

(10) Patent No.: US 7,571,403 B2
(45) Date of Patent: Aug. 4, 2009

(54) CIRCUIT VERIFICATION

(75) Inventors: Jawahar Jain, Santa Clara, CA (US); Subramanian K. Iyer, Austin, TX (US); Amit Narayan, Redwood City, CA (US); Debashis Sahoo, Stanford, CA (US); Christian Stangier, Los Altos, CA (US)

(73) Assignee: Fujitsu Limited, Kanagawa (JP)

( * ) Notice: Subject to any disclaimer, the term of this patent is extended or adjusted under 35 U.S.C. 154(b) by 169 days.

(21) Appl. No.: 11/279,177

(22) Filed: Apr. 10, 2006

(65) Prior Publication Data

US 2006/0173666 A1 Aug. 3, 2006

(51) Int. Cl.
*G06F 17/50* (2006.01)

(52) U.S. Cl. .............................................. 716/5; 716/7
(58) Field of Classification Search ........................ None
See application file for complete search history.

(56) References Cited

U.S. PATENT DOCUMENTS

| | | | | |
|---|---|---|---|---|
| 6,086,626 A | 7/2000 | Jain et al. | ...................... | 716/5 |
| 6,212,669 B1 * | 4/2001 | Jain | .............................. | 716/7 |
| 6,292,916 B1 | 9/2001 | Abramovici et al. | ........ | 714/736 |
| 6,308,299 B1 | 10/2001 | Burch et al. | .................... | 716/4 |
| 6,321,186 B1 | 11/2001 | Yuan et al. | ..................... | 703/15 |
| 6,473,884 B1 | 10/2002 | Ganai et al. | ..................... | 716/3 |
| 6,499,129 B1 | 12/2002 | Srinivasan et al. | ............. | 716/4 |
| 6,560,758 B1 * | 5/2003 | Jain | .............................. | 716/7 |
| 7,028,278 B2 * | 4/2006 | Jain | .............................. | 716/5 |

OTHER PUBLICATIONS

Narayan et al., "Partitioned ROBDDs—A Compact, Canonical and Efficiently Manipulable Representation for Boolean Functions," 1996 IEEE, pp. 547-554.*
G. Cabodi, P. Camurati, S. Quer, "Improved Reachability Analysis of Large Finite State Machines," IEEE ICCAD 7 pages, 1996.

* cited by examiner

*Primary Examiner*—Leigh Marie Garbowski
(74) *Attorney, Agent, or Firm*—Baker Botts L.L.P.

(57) ABSTRACT

In one embodiment, a method for verifying one or more particular properties of a circuit using a learning strategy to determine suitable values of particular verification parameters includes classifying each of multiple properties of a circuit according to circuit size and selecting a candidate property from the properties. The candidate property set includes one or more particular properties from each property class. The method also includes attempting to verify one or more particular properties of the circuit using the candidate property set and particular values of particular verification parameters. The method also includes determining suitable values of the particular verification parameters according the attempted verification of the particular properties of the circuit using the candidate property set and the particular values of the particular verification parameters.

4 Claims, 3 Drawing Sheets

CIRCUIT VERIFICATION

RELATED APPLICATION

This application claims the benefit, under 35 U.S.C. § 120, of U.S. patent application Ser. No. 10/444,782, filed May 23, 2003.

TECHNICAL FIELD OF THE INVENTION

This invention relates in general to the field of circuit verification and more particularly to circuit verification.

BACKGROUND OF THE INVENTION

The proliferation of integrated circuits (ICs) has placed increasing demands on the design of digital systems included in many devices, components, and architectures. The number of digital systems that include ICs continues to steadily increase and may be driven by a wide array of products and systems. Added functionalities may be implemented in ICs in order to execute additional tasks or to effectuate more sophisticated operations in their respective applications or environments. Additionally, system parameters of ICs may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an IC or a digital element is capable of performing its intended functionality. In other cases, verification techniques may be used in order to ascertain whether a selected characteristic, behavior, or property is present in a given target circuit. Flaws or inaccuracies in an IC or a digital element may inhibit system functionality and/or cause significant operational problems in a corresponding architecture.

SUMMARY OF THE INVENTION

Particular embodiments of the present invention may reduce or eliminate disadvantages and problems traditionally associated with circuit verification.

In one embodiment, a method for verifying one or more particular properties of a circuit using a learning strategy to determine suitable values of particular verification parameters includes classifying each of multiple properties of a circuit according to circuit size and selecting a candidate property from the properties. The candidate property set includes one or more particular properties from each property class. The method also includes attempting to verify one or more particular properties of the circuit using the candidate property set and particular values of particular verification parameters. The method also includes determining suitable values of the particular verification parameters according the attempted verification of the particular properties of the circuit using the candidate property set and the particular values of the particular verification parameters.

Particular embodiments of the present invention may provide one or more technical advantages. Particular embodiments increase efficiency of partitioned ordered binary decision diagram (POBDD)-based verification of circuits. Particular embodiments reduce time requirements associated with POBDD-based verification of circuits. Particular embodiments reduce memory requirements associated with POBDD-based verification of circuits. Particular embodiments reduce memory costs associated with POBDD-based verification of circuits. Particular embodiments provide superlinear speedup in the event of one or more circuit errors. Particular embodiments reduce the occurrence of space blowup in POBDD-based verification of circuits.

Particular embodiments provide a systematic method for covering a state space. Particular embodiments increase time and space efficiency of semiformal verification. Particular embodiments provide improved distribution of state-space coverage, such that state-space coverage is less localized. In particular embodiments, a continuous spectrum of time, memory, and coverage tradeoff is possible. In particular embodiments, less useful partitions are ignored according to a scheduling technique. In particular embodiments, only relatively easy states are covered, but uniform distribution is at least attempted.

Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which.

DETAILED DESCRIPTION OF EXAMPLE EMBODIMENTS

Figure 1:
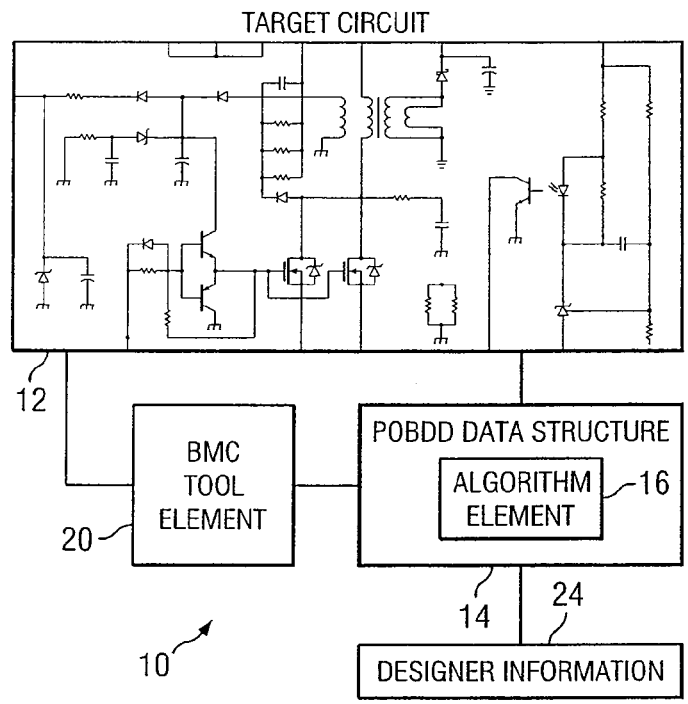
FIG. 1 illustrates an example system for determining one or more reachable states in a circuit using one or more partitioned data structures.

FIG. 1 illustrates an example system 10 for determining one or more reachable states in a circuit (such as target circuit 12) using one or more partitioned data structures. System 10 may include a partitioned ordered binary decision diagram (POBDD) data structure 14 that includes an algorithm element 16. Additionally, system 10 may include a bounded model checking (BMC) tool element 20 and a segment of designer information 24 that may be communicated to POBDD data structure 14. System 10 may generally be positioned within, or otherwise operate in conjunction with, any integrated circuit, digital element, processing configurations, or binary architecture in which verification procedures or processes may be implemented. Additionally, system 10 may be provided in cooperation with any device, component, hardware, software, object, or element associated with digital processing of information or data.

System 10 operates to provide a verification process capable of reaching significant depths in sub-spaces of target circuit 12. By using POBDD data structure 14 and an analysis that involves imaging and preimaging operations, selected states that are provenly deep may be identified. These states may then be represented in a BDD format and then mapped as a conjunctive normal form (CNF) formula. The CNF formula may then be provided to BMC tool element 20 as a set of starting states from which to begin an enhanced verification analysis. BMC tool element 20 may then execute bounded model checking operations using these starting states (instead of initiating its operations from a single state) in order to effectuate a verification procedure associated with target circuit 12. A single state generally represents an initial state that is predominantly shallow. By providing starting states that are already deep, BMC tool element 20 achieves enhanced verification results because it may reach deeper into target circuit 12. In addition, the initial deep states may be obtained using POBDD data structure 14 in an optimal time interval, which in turn results in a significant advance in efficacy for the verification procedure.

System 10 provides a verification architecture that is significantly faster than other verification or simulation techniques. This may be due, in part, to the integration of several verification approaches that may be combined in order to enhance a starting point associated with bounded model checking operations. In certain embodiments, such a verification approach may be particularly beneficial for elements that have a large sequential depth.

System 10 may also extend reachability parameters associated with target circuit 12. New or unexplored deep states within target circuit 12 may be uncovered using system 10. System 10 may allow verification to be executed deep into circuits. System 10 may achieve a significant reduction in latency associated with the verification process. Depth may be an exact depth or the approximate depth depending on what the user wants. The approximate depth is only an upper bound on the actual depth. To calculate the depth of the states, the following operation may be implemented. Assume the user is starting from set of states $s\_0$ and assume given windows $w, w'$ where $w'$ is a complement of $w$). Referring to $s\_0$ as a BASE-set, the following operations may be executed:
1. image on BASE-set (under window $w$) and get $s\_1$;
2. pre-image on $s\_1$ in window $w'$ and get pre-$s\_1(w')$;
3. image on pre-$s\_1(w')$ (under window $w$) and get $s\_1'$;
4. calculate $s\_1''=s\_1-s\_1'$ $s\_1''$ reflecting the set of states in window $w$ that cannot be reached from outside the window. $s\_1''$ becomes now our starting point (BASE-set) to calculate states of even greater depth.

In general, steps 1-4 can be suitably repeated, giving states with greater and greater depth. This takes into consideration states that are of a given depth as calculated from within the window $w$. It can be suitably modified, where appropriate, to include states whose depth is some minimum "d" where the path of length "d" criss-crosses from one window to another. This can be achieved by keeping a set whose depth is updated during each step of image/pre-image. There can be numerous ways of keeping a running count of depth of some states. A simple way to do this calculation can be seen if the reachability is done in a breadth-first manner. To each partition $w\_1, \ldots, w\_k$ the above procedure may be applied and then a calculation may be executed reflecting the actual depth of a state even if it is obtained by a criss-cross path starting form initial state.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in a verification environment. Target circuit 12 may be designed specifically to include (or be capable of performing) some property. The term "property" as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 is a representation of a Boolean function for manipulation. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications, where appropriate. POBDD data structure 14 may receive designer information 24 and perform a preliminarily analysis on target circuit 12 in order to retrieve a first set of states based on designer information 24. The first set of states from a sampled sub-space may then be used in order to augment or otherwise enhance the capabilities of BMC tool element 20. POBDD data structure 14 may invoke one or more algorithms included in algorithm element 16 in order to evaluate a selected property associated with target circuit 12. The first set of states allows BMC tool element 20 to extend deep into target circuit 12.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

POBDD data structure 14 is generally faster than other approaches used in verification operations. Moreover, the partitioned structure of POBDD data structure 14 is compact and may provide for much easier parallelization. Additionally, POBDD data structure 14 may offer dynamic partitioning that avoids memory deterioration, which may also be referred to in certain applications as "memory blowup." POBDD data structure 14 may cover a large volume of states within target circuit 12 quickly and, further, break designs into loosely coupled sets of interacting finite state machines.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12. POBDD data structure 14 may then generate a first set of states, represent the first set in a BDD format, and map the BDD format into a CNF formula to be forwarded to BMC tool element 20.

CNF is a conjunction of clauses, where clauses are either attribute-value conditions or disjunctions of attribute-value conditions. A Boolean expression having junctors in {AND, OR} is in conjunctive normal form if no junctors are negated and if no AND junctor is dominated by an OR junctor. For example, (color=red or color=green) and (shape=rectangular) is a formula in CNF. A Boolean formula in this form is expressed as an AND of clauses, each of which is the OR of one or more literals. The theory of CNFs may also be thought of as a conjunction of disjunctions. Each disjunction can be represented as a clause that includes positive literals and negative literals. The variables may be quantified universally. For logic programming (Prolog, Fril, etc.) it is beneficial to be able to transform sentences into statements a computer can accommodate. Logic programming statements may take the form of horn clauses that are conditional sentences with a particularly simple structure. It can be shown that every propositional logic sentence is equivalent to a sentence in conjunctive normal form.

In particular embodiments, by invoking or implementing a selected algorithm within algorithm element 14, POBDD data structure 14 may selectively explore deep into target circuit 12 without looking at an entire circuit architecture or configuration. Viewing an entire circuit element may slow the verification process significantly. Instead, algorithm element 16 may be invoked such that predetermined locations within target circuit 12 are visited in order to evaluate a small fragment of states (within sub-spaces) in a deep manner.

Algorithm element 16 is a data processing object that may include one or more algorithms that allow for a specific or designated property to be explored or verified in target circuit 12. Algorithm element 16 may be included within POBDD data structure 14 or provided external thereto in accordance with particular processing needs or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, objects, or elements operable to facilitate the verification operations being executed by POBDD data structure 14.

For purposes of example and teaching it is useful to provide a further explanation of some of the algorithms that may be used in verifying selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).
2. Reduction. For an OBDD G compute the equivalent reduced OBDD.
3. Equivalence test. Test whether two functions represented by OBDDs are equal.
4. Satisfiability problems. Problems may include:
   Satisfiability. For an OBDD G representing f find an input a for which f(a)=1 or output that no such input exists.
   SAT-Count. For an OBDD G representing f, compute the number of inputs a for which f(a)=1.
5. Synthesis (also referred to as apply). For functions f and g represented by an OBDD G include into G a representation for f$\otimes$g where $\otimes$ is a binary Boolean operation (e.g., $\wedge$).
6. Replacements (also called Substitution).
   Replacement by constants. For a function f represented by an OBDD, for a variable $x_i$ and a constant $c \in \{0, 1\}$ compute an OBDD for $f_{|xi=c}$.
   Replacement by functions. For functions f and g represented by an OBDD and for a variable $x_i$ compute an OBDD for $f_{|xi=g}$.
7. Universal quantification and existential quantification. For a function f represented by an OBDD and for a variable $x_i$ compute an OBDD for $(\forall x_i : f) := f_{|xi=0} \wedge f_{|xi=1}$ or $(\exists x_i : f) := f_{|xi=0} \vee f_{|xi=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

BMC tool element 20 is a component operable to execute bounded model checking operations on target circuit 12. BMC tool element 20 may receive information from POBDD data structure 14 and use that information in order to execute verification techniques on target circuit 12. BMC tool element 20 may use semi-formal verification approaches and be further enhanced by using a first set of states provided by POBDD data structure 14. BMC tool element 20 may employ SAT techniques to execute proper bounded model checking. In bounded model checking, a Boolean formula is constructed that is satisfiable if the underlying state transition system can realize a finite sequence of state transitions that reaches certain states of interest. BMC tool element 20 may include any suitable device, component, hardware, software, object, or element operable to execute one or more bounded model checking processes or operations such that selected sub-spaces of target circuit 12 may be verified or validated.

BMC tool element 20 may also be appropriately modified such that it can utilize a first set of states instead of a single initial state. This may allow system 10 to reach provenly deep sub-spaces within target circuit 12. Accordingly, the capacity of the program within BMC tool element 20 is effectively enhanced in order to improve the verification process. After the BMC program is executed, it may be determined that neighboring segments have been exhaustively explored such that an adequate sampling of target circuit 12 has been effectuated. The decision of whether to continue sampling subspaces of target circuit 12 may rest with an end user or controlled by the BMC program characteristics.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function $f: B^n \rightarrow B$ defined over n inputs $X_n = \{x_1, \ldots, x_n\}$. The partitioned-ROBDD representation $X_f$ of f is defined as follows:

Given a Boolean function: $f: B^n \rightarrow B$ defined over $X_n$, a partitioned-ROBDD representation $X_f$ of f is a set of k function pairs, $\chi_f = \{(\omega_1, \mathcal{F}_1), \ldots, (\omega_k, \mathcal{F}_k)\}$ where, $\omega_i B^n \rightarrow B$ and $\mathcal{F}_i: B^n \rightarrow B$, for $1 \leq i \leq k$, are also defined over $X_n$ and satisfy the following conditions:

1. $w_i$ and $\mathcal{F}_i$ are represented as ROBDDs with the variable ordering $\pi_i$, for $1 \leq i \leq k$.
2. $w_1 + w_2 + \ldots + w_k = 1$
3. $\mathcal{F}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \mathcal{F}_i)$ may represent a partition of the function f. In the example, the term "partition" is not being used in the sense where partitions have to be disjoint. If, in addition to conditions 1-3 (provided above), $w_i \wedge w_j = 0$ for $i \neq j$, then the partitions may be orthogonal. Each $(w_j, \mathcal{F}_i)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi = \{\psi_1, \ldots, \psi_k\}$ is called a decomposition set and it corresponds to the internal cut set selected, typically, by the naive cut or the smart cut process, and each $\psi_i \in \Psi$ is a decomposition point. Let $\Psi_{bdd} = \{\psi_{1_{bdd}}, \ldots, \Psi_{k_{bdd}}\}$ represent the array containing the ROBDDs of the decomposition points, i.e., each $\psi_i \in \Psi$ has a corresponding ROBDD, $\psi_{i_{bdd}} \in \Psi_{bdd}$, in terms of primary input variables as well as (possibly) other $.\psi_j \in \Psi.$, where $\psi_j \neq \psi_i$. Similarly, the array of $\psi_{i_{bdd}w_i}$ may be represented by $\Psi_{i_{bdd}w_i}$. The composition [?] of $.\psi_i$ in $f_d(\Psi, X)$ may be denoted by $f_d(\Psi, X) \cdot (\Psi_i \leftarrow \psi_{i_{bdd}})$, where, $$f_d(\Psi,X) \cdot (\psi_i \leftarrow \psi_{i_{bdd}}) = \overline{\Psi_{i_{bdd}}} \cdot f_{d\overline{\psi_i}} + \psi_{i_{bdd}} \cdot f_{d\psi_i} \qquad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\Psi_{w_i}$ and $f_{d_{w_i}}$ may be created. By composing $\psi_{bdd_{w_i}}$, in $F_{d_{w_i}}$, the partition function $f_i = f_{w_i} f_i = f_{w_i}$ may be achieved. Thus, given a set of window functions $w_i$, the partitioned-ROBDD $x_f$ of f may be given by $\chi_f = \{(w_i, w_i \wedge \int_{w_i}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{w_i}$ have disjoint support, $|\mathcal{F}_i| = |w_i \wedge f_i| = (k + |f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\mathcal{F}_i|$ can be $O(|w_i||f_i|)$ in the worst case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1x_2, x_1\overline{x_2}, \overline{x_1}x_2$ and $\overline{x_1x_2}$.. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$\text{cost}_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_x}{f}\right) \quad (3)$$

and $r_x(f)$ represents the redundancy factor and is given by, $$r_x(f) = \left(\frac{|f_x + f_{\overline{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$\text{cost}_x(F) = \sum_{i=1}^{k} \text{cost}_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as a.$\Psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\overline{x}}}$ and $\Psi_{\overline{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\Psi_{j_{bdd}}$. The window functions may be either a PI and its complement or some $\Psi_{k_{bdd}}$ and its complement that is expressed in terms of PIs only and that has a small size.

Once the window function w is obtained, two partitions ($w \wedge f_{d_w}, \psi_w$) and ($\overline{w} \wedge f_{d_w}, \psi_{\overline{w}}$) may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the i$^{th}$ partition given by $f_{d_w i}$ and $\psi_{w_i}$, the final step is to compose $\psi_{w_i}$ in $f_{d_w i}$, i.e., $f_{d_w i}(\psi, X)(\psi \leftarrow \psi_{bdd_w i})$. Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$s. This may ensure that a decomposition variable needs to be composed only once in $f_d$.

Figure 2:
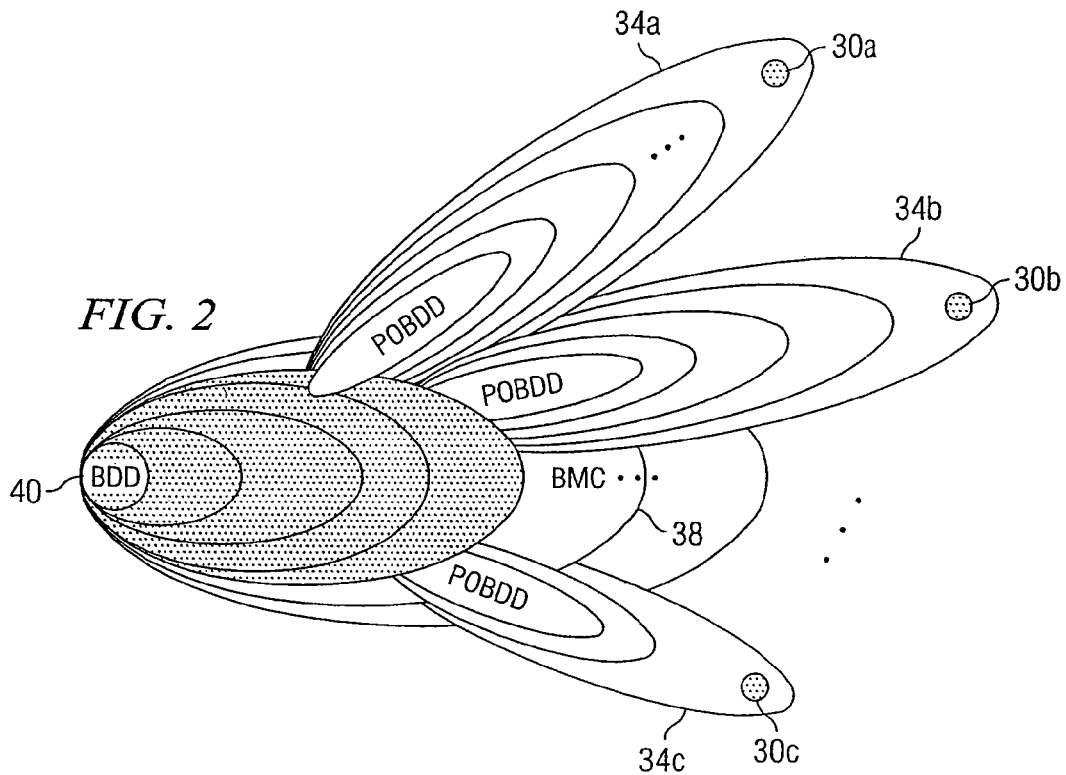
FIG. 2 illustrates example interaction of elements of the system illustrated in FIG. 1.

FIG. 2 illustrates example interaction of elements of the system illustrated in FIG. 1. FIG. 2 illustrates a set of starting points 30a-c, a set of POBDD elements 34a-c, a BMC element 38, and a BDD element 40. These elements are abstractly represented and are intended to reflect general principles associated with system 10. POBDD techniques may be employed and an analysis, which may include imaging/pre-imaging operations, may be executed in order to determine a first set of states that are provenly deep and that are communicated to BMC tool element 20. POBDD techniques may refer to any operation that may be executed on a data structure in order to convert it into a canonical form. Partitioned refers to the fact that the Boolean space is being broken into different sub-spaces.

For purposes of teaching, it is helpful to explain some of the imaging and preimaging operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In another example offered for purposes of teaching, it is assumed that line 1 and line 2 are states, whereby line 1 and line 2 are parallel and separated by a transition/relation element. In certain scenarios, the reflection of line 2 affects information associated with line 1. However, what is generally sought is everything reflected by either line 1 or line 2 exclusively. The image and preimage operations may be used in order to determine what is being received from each of the lines. By using the process of subtraction, it may be determined what is included in line 1 and line 2. What is left may be referred to as genuine objects, contenders, or choices that maintain their integrity. From this information, it can be determined what is causing confusion or errors and eliminate these elements from the process.

In another example, consider the case where set 1 includes states 1, 2 and 3. Further consider set two, which includes states 4 and 5. All of these elements may be reflected in states 10 and 11. In analyzing states 10 and 11, a reflection is provided that is coming from states 1, 2, 3, 4, and 5. It may be recognized that it is improper to consider 4 and 5 in an analysis associated with set 1 because these elements are associated with set 2. Thus, states 4 and 5 may be subtracted from the set whereby what is left is the genuine set from set 1 (states 1, 2, and 3). The distance between sets 1 and 2 can be identified as one unit. The difference between set 2 and set 0 is two units. A calculation may then be made, at a distance of one unit, between set 1 and set 0. In a next step, the analysis may shift to set −1 and the analysis may continue to set −2 and so forth. In this sense, the information is inductively being amassed such that the analysis continues to move back in order to generate greater distances and depth. This procedure allows verification of states deeper within target circuit 12.

In an example embodiment, "deeper" generally refers to a depth parameter associated with target circuit 12, which is being analyzed. Certain states may be reachable and other states may be incapable of being reached without performing preliminary tasks first. States generally have different depths because some fixed point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing properly verification techniques. By using POBDD data structure 14, some states may be calculated that are potentially deep or certain states may be projected as usually deep and those states may be targeted for sampling.

Referring back to FIG. 2, BMC element 38 allows a small sampling or segment of a sub-space to be explored in association with a fixed point. Once the fixed point is reached, a fixed point calculation may be executed on another sub-space. The random sampling may be executed on multiple sub-spaces, whereby the first set of states is effectively handed off by POBDD elements 34a-c to BMC element 38. After identifying the first set of states, it may be determined which sub-spaces have the greatest depth. For the sub-spaces that have the greatest depth, a particular set of states may be assumed to be the deepest set of states that are easily calculated. These states may be provided to BMC element 38 to take as an initial set of states in executing a deeper verification of a given circuit under test. BDD element 40 serves as the foundation or core protocol on which POBDD and BMC operations are predicated.

POBDD based BMC allows for the possibility of "Navigated Traversal" in choosing a direction to explore deeply. System 10 may further allow for a controlled form of mixing Breadth First Search (BFS) with Depth First Search (DFS) because it may allow for reaching deep states (potentially selectively).

Appropriate time intervals may also be provided in conjunction with the sampling of multiple sub-spaces within a given circuit under test. A certain amount of time may be configured in order to evaluate various sub-spaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

Formal verification of a circuit may require that a reachability-based analysis be performed on the circuit to determine which states are reachable from an initial state of the circuit, which may include constructing a set of transition relations (TRs) and conjuncting every member of the set. All primary inputs and present state variables of the circuit may then be existentially quantified using the resulting formula. During the reachability-based analysis, one or more graphs may blow up, especially during conjunction. Because of problems associated with this type of blowup, BDD-based formal verification may be impractical. Formal verification may be limited in practical application to circuits that include approximately 100 or fewer latches or other circuit elements. However, many circuits include tens of thousands (or more) of circuit elements.

Figure 3:
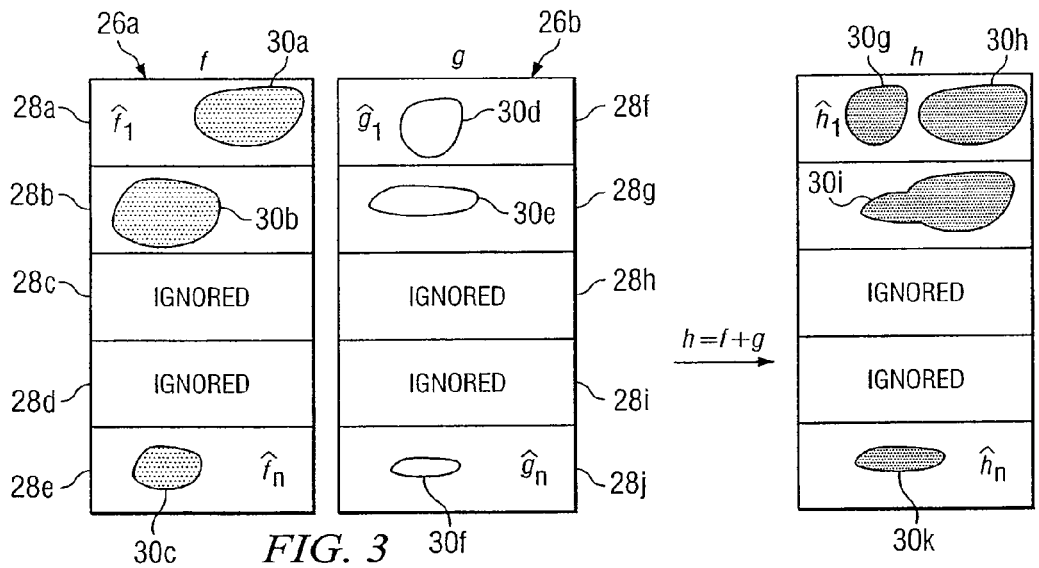
FIG. 3 illustrates example semiformal verification using one or more partitioned ordered binary decision diagrams (POBDDs)

To cover a circuit, semiformal verification may be used. FIG. 3 illustrates example semiformal verification using one or more POBDDs. Partition 26a includes five subspaces 28, and partition 26b also includes five subspaces 28. Coverage 30a of subspace 28a may be combined with coverage 30d of subspace 28f using one or more Boolean operations, coverage 30b of subspace 28b may be combined with coverage 30e of subspace 28g using one or more Boolean operations, and coverage 30c of subspace 28e may be combined with coverage 30f of subspace 28j using one or more Boolean operations, as described above. Subspaces 28c, 28d, 28h, and 28i may be ignored according to an algorithm, as described more fully below. In particular embodiments, one or more sophisticated BDD techniques are used to provide adequate coverage of a circuit. Particular embodiments include two general strategies for semiformal verification. A first general strategy in semiformal verification is greedy searching. According to a greedy search technique, when a state space is explored, large BDDs are ignored, but at the same time coverage of a large subspace (perhaps even as large a subspace as possible) is more or less maximized. A greedy search may, but need not, be a directed search.

Ignoring large BDDs may greatly reduce state-space coverage, perhaps even to an undesirable degree. Because the size of a BDD (which may be measured by the amount of information that may be required to describe the circuit) does not necessarily indicate the number of states (or minterms) covered by the BDD, a density function of the BDD may be used to determine a contribution of the BDD to total state-space coverage. In particular embodiments, the size of a BDD is balanced against the state-space coverage of the BDD. Arbitrary reduction of a TR may prevent the TR from capturing one or more transitions in the circuit. On the other hand, if the TR is not reduced, meaningful BDD computations using the TR may be impractical. Moreover, if a large BDD is partitioned, it may be difficult to determine which of the partitions to explore.

A second general strategy in semiformal verification is design abstraction. To explore a subset of states of a circuit or perform a state-space search from an initial state of the circuit, a semiformal search may be directed to multiple windows. In particular embodiments, the windows are specified manually by a circuit designer. One or more states and input constraints applicable to the semiformal verification may be specified by the designer or determined from a simulation dump.

Multiple POBDDs may be used to cover a state space. Each POBDD corresponds to a window that is characterized by state-coverage density per BDD node and characterized by BDD size. One or more windows, in which BDD computation results in greater blowup, are marked. One or more of the marked windows may be problematic at a future point. Based on BDD history in a window, the window may be characterized as "easy" or "difficult." Greedy communication, which may facilitate coverage of multiple parts of a state space, may be used to more or less maximize state coverage. As an example, in particular embodiments, communication among multiple partitions is prioritized as follows: (1) communication from higher-density, easier partitions to lower-density, easier partitions are a first priority; (2) communication from higher-density, easier partitions to higher-density easier partitions are a second priority; and (3) communication from higher-density, easier partitions to lower-density, more difficult partitions are a third priority. One or more communications that are more or less unlikely to be helpful may be chosen last.

To handle a large TR, one or more partial assignments may be used to reduce the circuit before the TR is constructed. In particular embodiments, to handle difficult circuits (in which fewer than all partitions may be constructable), only M out of N partitions are chosen, and fix-point iteration and communication is carried out only among the chosen partitions. As an option, one or more fix-point iterations may be terminated when a new set of states being generated includes fewer states than a predefined k percent of a previously computed set of states. When a TR is reduced or a partition is generated, it may be determined whether a meaningful transition may occur from a particular partition to one or more remaining portions of the state space. A BDD may be constructed from a subset of states visited in a simulation dump. The states may then be partitioned using a POBDD splitting variable heuristics technique. One or more computed windows may then be used to generate assignments for reducing one or more large TRs.

Figure 4:
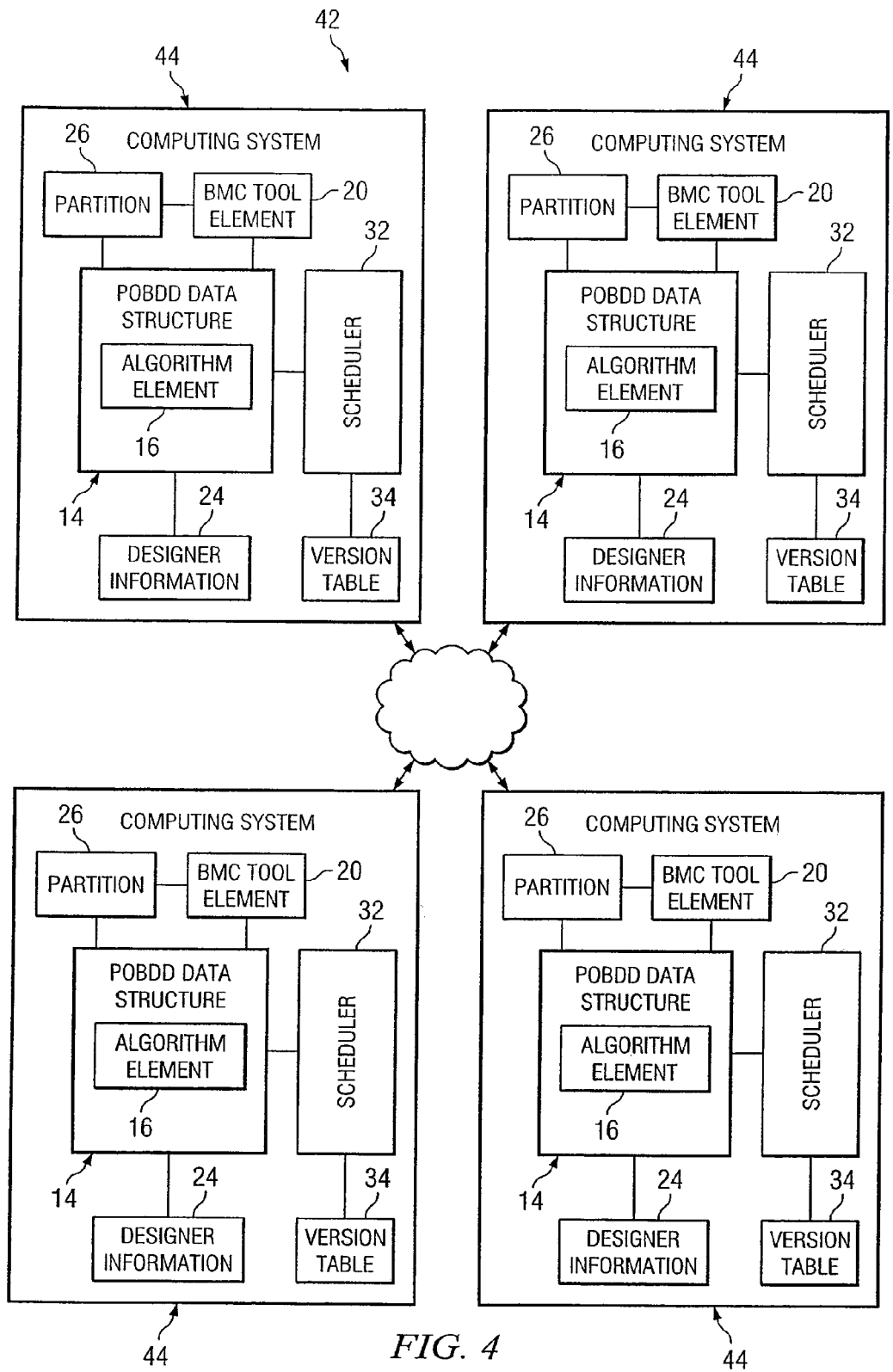
FIG. 4 illustrates an example system for determining one or more reachable states in a circuit using distributed computing and one or more partitioned data structures.

FIG. 4 illustrates an example system 42 for determining one or more reachable states in a circuit using distributed computing and one or more partitioned data structures. As described above, one or more POBDDs may be used to perform a reachability-based analysis on a circuit (such as target circuit 12) to verify one or more characteristics of the circuit. A POBDD is canonical and may be used for combinational equivalence checking. In a reachability-based analysis using one or more POBDDs, a reachable state set is represented by a POBDD. Memory requirements may be reduced by storing only one partition in a particular memory unit at a time and by saving, to a disk or other storage medium, a partition that is not currently being processed. Fix-point computations may be separately performed on each partition using a reachability algorithm and a POBDD package.

System 42 may be used to perform a reachability-based analysis on a circuit (such as target circuit 12) to identify states that are reachable from an initial state of the circuit. System 42 includes multiple computing systems 44 coupled to each other using one or more links, each of which includes one or more computer buses, local area networks (LANs), metropolitan area networks (MANs), wide area networks (WANs), portions of the Internet, or other wireline, optical, wireless, or other links. Although system 42 is illustrated as including four computing systems 44, the present invention contemplates two or more computing systems 44. In particular embodiments, two or more computing systems 44 may share one or more common components with each other. To perform a reachability-based analysis on target circuit 12, target circuit 12 is logically divided into partitions 26 (or windows) and each partition 26 is processed using a computing system 44 in a distributed processing environment, such as a cluster-based computing environment. A partition 26 of target circuit 12 is a representation of a logical, functional, or other portion of target circuit 12. In particular embodiments, partitions 26 may vary in size (which may be measured by the amount of information that may be required to describe the circuit). Computing systems 44 may process partitions 26 more or less in parallel. Each partition 26 runs until a fixed point is reached and then communicates with one or more other partitions 26.

System 42 may reduce time and memory requirements associated with a reachability-based analysis of target circuit 12. As an example and not by way of limitation, consider a computing system 44 that includes one gigabyte of random access memory (RAM) and a circuit that requires thirty-two gigabytes of RAM for a reachability-based analysis. Using a disk would be impractical due to slow disk access, and the processing system, alone, would be unable to perform the reachability-based analysis. Instead, the analysis may be distributed among thirty-two computing systems 44, that each include one gigabyte of RAM, operating more or less in parallel to reduce memory costs associated with the analysis and to achieve faster runtime.

In particular embodiments, a computing system 44 includes a POBDD data structure 14 (which includes an algorithm element 16), a BMC tool element 20, designer information 24, a partition 26, a scheduler 32 (described below), and a version table 34 (also described below). Although a particular computing system 44 is described and illustrated as including particular components in a particular configuration, the present invention contemplates any suitable computing system 44 including any suitable components in any suitable configuration. As an example and not by way of limitation, in particular embodiments, computing system 44 may include one or more components in addition or as an alternative to POBDD data structure 14, BMC tool element 20, or designer information 24 for performing additional or alternative analyses to the verification analyses described above. In particular embodiments, computing system 44 need not include POBDD data structure 14, BMC tool element 20, or designer information 24. In particular embodiments, two or more computing systems 44 in system 42 need not include components or configurations of components that are similar to each other. A processing system 44 may be integrated, fully or partially, into one or more computer systems including one or more input devices, output devices, storage media, and processors and associated memory units. Processing system 44 may, as an alternative, be coupled to one or more computer systems.

As described above, to perform a reachability-based analysis on target circuit 12, target circuit 12 is logically divided into multiple partitions 26. Each partition 26 is processed at a computing system 44 until a fixed point is reached. When a fixed point is reached, computing system 44 communicates with one or more other computing systems 44 regarding the performed analysis at computing system 44 or one or more other performed analyses at other computing systems 44. An initial state may be expanded to multiple windows using a limited forward-reachability analysis to reduce idle computing-system time that could reduce gains associated with having computing systems operating in parallel. Communication among partitions 26 may be reduced by tagging the POBDDs of each partition 26 such that it can be determined when and among which computing systems 44 communication is desirable. Communications may be prioritized such that higher-density partitions 26 communicate with lower-density partitions 26 to increase coverage in one or more partitions 26. Space blowup can be reduced, or even avoided in particular embodiments, by rejecting partitions 26 that include one or more unusually large BDDs, which can, in particular embodiments, provide exponential speedup in nonerror cases as a result of sampling.

One or more procedures can be used to reduce, or even avoid in particular embodiments, communication overhead and redundant computation among partitions 26. In particular embodiments, a scheduling algorithm may be used to schedule communication among partitions 26 to reduce costs associated with communication among partitions 26. The scheduling algorithm may facilitate greedy communication in a parallel computing environment. According to one scheduling algorithm for communication among partitions 26, each partition 26 has (1) a first vector of a version of a state reached in the partition 26 and (2) a second vector of one or more versions of one or more states reached in one or more other partitions 26. The first vector is denoted Latest, and the second vector is denoted LastCommunicated. One or more diagonal element of LastCommunicated (such as LastCommunicated[i][j]) represents a result of a preceding least fix point (LFP) computation. Scheduler 32 may be used to schedule communication between partition 26 and one or more other partitions 26. Version table 34 may indicate one or more currently needed computations, and scheduler 32 may access version table 34 to schedule communication. Version table may contain the following information regarding partition 26:

LastCommunicated[i][j]<Latest[j] indicates that Partition [i] must communicate with Partition[j].

LastCommunicated[i][j]=Latest[j] indicates that Partition [i] is up to date with Partition[j] and need not communicate with Partition[j].

LastCommunicated[i][i]<Latest[i] indicates that Partition [i] must run an LFP computation.

LastCommunicated[i][i]=Latest[i] indicates that Partition [i] has reached a fixed point.

Initially, all elements of LastCommunicated can be set to zero and all elements of Latest can be set to one.

When partition 26 has reached a new state as a result of an LFP computation or as a result of communication with one or more other partitions 26, partition 26 increases a first vector of partition 26 (Latest[i]++). If the LFP computation or the communication has been completed successfully, a second vector of partition 26 is updated (LastCommunicated[i][j]=Latest[j]). If each element of a row in version table 34 is equal to a corresponding element of Latest, no computation is required for Partition[i], and, if this condition is true for all partitions, a fixed point has been reached.

To determine a computation order, each partition 26 may be assigned a priority indicator based on BDD size and number of states covered. The priority or other suitable indicator can reflect an amount of time taken to reach a fixed point. As an example and not by way of limitation, the following algorithm, represented by pseudocode, may be used:

```
chooseTask{
    pick a small (few BDD nodes) partition (which needs to be computed)
    if this partition needs to communicate with a partition,
        then invoke communication task (communicate with one partition),
        else invoke LFP task
}
```

Function representations are often too large for substantially efficient monolithic representation (i.e., as a single graph, such as ROBDD) and may benefit from partitioning. To perform a partition-based analysis of a function representation, one or more of the following questions may be answered:

1. When should the function be broken into disjoint subspaces?
2. How many subspaces should be created?
3. Which subspaces (out of an exponential number of possibilities) should be generated?
4. Since representations may be created for manipulation, what if the manipulation results are simple?
5. When and how should a subset of such representations be combined into a single graph?
6. Since partitioning generates multiple independent representations and manipulations, what computation order should be used?

These questions may be fundamental to a practical partitioning manipulation algorithm, and an efficient solution may lead to improved practical results. Particular embodiments enable efficient analysis of difficult benchmark circuits. Particular embodiments provide advantages over previous POBDD techniques. Particular embodiments can be used in reachability calculations. Particular embodiments can be used in industrial applications, such as identifying bugs or other problems in circuit designs.

Particular embodiments provide substantial partitioning flexibility. In particular embodiments, a parity OBDD introduces functional parity nodes to a data structure, which may allow a smaller (perhaps even exponentially smaller) representation of a function than an ROBDD may allow. Other data structures (such as k-IBDDs and k-OBDDs) may also provide partitioning flexibility, but may not be as practical as parity OBDDs.

A POBDD is a BDD model that allows at least some flexibility (the acceptance mode is disjunction), which may include multiple variable orderings. Typical empirical use of POBDDs has been implemented by allowing each window to represent a disjoint subspace. In particular embodiments, POBDDs provide substantial balance between flexibility and manipulability of symbolic graph representations. As a result, POBDDs may provide acceptable results with respect to a variety of problems. POBDDs offer multiple computational choices when calculating reachable state space of a finite state machine (FSM), which may be a difficult manipulation problem.

The problem of reachability includes state-space representation and state-space manipulation, which may be successive image computation operations on fragments of state space until all (or substantially all) reachable states have been explored. Particular embodiments may provide improved efficiency with respect to both creating efficient subspaces and performing image/fix-point computation.

Incompatible functions and trace-centric computation may be used to describe and understand how a flexible POBDD approach may be used. For a given function, there may be multiple choices of partitioned representations. Some of these choices may provide one or more advantages over others. A logic design may include modules or functions that have one or more substantially different characteristics. As a result, it may be inefficient to represent those module or functions in the same data structure under a unified representation. Such functions may be more or less incompatible with each other, and it may be advantageous to separate them from each other. The following empirical definition may be used: a set of functions is incompatible if the totality of their individual representations is more compact (perhaps even exponentially more compact) than their combined representation as a whole. Consider the symbolic representation of functions in terms of ROBDDs. If a function $f$ is decomposed, for example, disjunctively into $f_1$ and $f_2$, $f_1$ and $f_2$ would be incompatible if the sum of their individual ROBDD sizes (perhaps under orders that are different from each other) is less than the size of the single ROBDD that represents $f$.

A goal of partitioning is to isolate the most incompatible state-space fragments. However, it may be difficult (or even impossible) to identify two functions that are incompatible with each other without constructing their representations. As a result, static analysis of functions may be more or less unusable to predict the validity of a particular partitioning choice. In particular embodiments, candidate sub-functions may be separated from each other, their sizes may be measured when represented independently under a more or less optimal order, and it may be determined whether they are incompatible with each other. An algorithm for separating sub-functions from each other, measuring their sizes, and determining whether they are incompatible with each other is described below.

Different algorithms for traversing state space often differ from each other in effectiveness, and different principles may be mixed and matched with each other in a dynamically alterable fashion. It may be advantageous, if possible, to explore multiple paths by choosing multiple options (which may, for example, include creating more partitions or stopping the processing of the partition and choosing a first window or a second window). Each option may be associated with computation cost. As an example, with an initial state and transition relation, it may be possible to either perform one or more steps of an image computation and then partition or create partitions before performing the image computation. Each option provides a separate trace of possible computations. The results of each choice may be examined with respect to a particular trace, and a particular method may be chosen. As another example, if a different partition-processing schedule is chosen or if more partitions are created, space explosion may be more or less avoided.

In particular embodiments, instead of an a priori prediction being made, one or more particular options may chosen only when needed. Various procedures may be thought of as being embedded in an oracle that triggers another algorithm based on local conditions. This may enable selection from multiple choices at each computation step, which may allow one or more choices to be made dynamically throughout the computation. Therefore, in particular embodiments, there may be multiple ways to overcome memory bottleneck. In contrast, previous OBDD approaches provided few (if any) acceptable alternatives in the event of state-space explosion. A technique for embedding intelligent choices in a POBDD algorithm at different computation stages (such as, for example, building an initial graph representation, dynamically increasing partitions during blowup, and communicating states from one subspace to another subspace or choosing to suspend such a communication) is described below.

During initial partitioning, a reachability or model checking tool runs until BDD size blowup is detected. This may be measured either absolutely as a maximum size of the symbolic representation of the image or in a relative way as the ratio of the representation of the reached states before and after any image computation. In particular embodiments, the latter approach may be adopted, with a threshold factor chosen a priori. This approach may provide one or more advantages when predicting which designs will be better suited to a partitioned approach than to a traditional, nonpartitioned approach. When the size of the representation blows up (and the blowup is detected) during the initial nonpartitioned computation, a number of partitions may be created, which may be done by selecting n splitting variables and cofactoring with respect to the corresponding $2^n$ assignments to create new partitions. In particular embodiments, the new partitions may each have a variable order that is different from the original variable order.

The choice of splitting variable may determine the partitions that are created, which may, in turn, affect the effectiveness of the approach. The splitting variable is selected using a cost function. For each variable, the cost function may take into account the relative BDD sizes of the positive and negative cofactors with respect to the BDD size of the original graph. The relative BDD sizes should be relatively balanced, and, at the same time, the sum of their BDD sizes should be comparable to the BDD size of the original graph. This may be measured using an appropriate cost function. Measurement of graph size to determine the occurrence (and subsidence) of blowup may be taken with respect to the BDD size of the TR, the image representation, or both. TR size may remain more or less unchanged, but BDD size may vary substantially due to dynamic variable reordering. The best variables with respect to each of these choices may be identified and the variable that minimizes total BDD size of the two co-factors may be selected, which may in particular embodiments result in a variable that defines two partitions that are as disjoint as possible being selected. As an example and not by way of limitation, the following algorithm, represented by pseudocode, may be used:

```
SelectPartitioningVars(basis bdd F) {
    for (each method i = 1 to m) {
        get ordered splitting variable list using F.
        select top k variables.
        for (each subspace j = 1 to 2^k) {
            cost[i][j] = size of the cofactor F_j.
        }
        cost of method i = Σ_j cost[i][j]
    }
    select method with lowest cost.
    return corresponding vars
}
```

When BDD size blowup is detected during computation in a partition, dynamic repartitioning may be triggered. Repartitioning may be performed by splitting the partition by cofactoring the entire state space based on one or more splitting variables until the blowup has been ameliorated in each partition that has been created. Initially, the partitioning may be performed using one splitting variable (which may be chosen as described above). Each new partition may be checked to see whether blowup has subsided. If it has not, repartitioning may be performed with respect to that partition.

As described above, image computation includes multiple steps of alternating composition and conjunction. Often, blowup in BDD size during an intermediate step of image computation is a temporary phenomenon that eventually subsides by the time the image computation is completed. If BDD size blowup is a temporary phenomenon, invocation of dynamic global repartitioning could create a large number of partitions that have BDD sizes that eventually become very small. Therefore, it may be advantageous to create partitions locally only for that particular image computation and then recombine them before the end of the image computation. These local partitions may be created by cofactoring using a previously generated ordered list of splitting variables. As an example and not by way of limitation, the following algorithm, represented by pseudocode, may be used:

```
ComputeImage(T R, state set R, variable list L){
    do {
        one microstep of image
        if (blowup) {
            varList - Top k vars from L
            create partitions using varList
            for (each new partition)
                recursively do all remaining micro steps
        }
    }while(microsteps remain)
}
```

A technique for state-space traversal that is based on the scheduling of partitions based on difficulty is described below. An increase in the likelihood of catching an error as more of the state space is covered may be expected. Therefore, some errors may be caught earlier if more state space is covered sooner. To accomplish this, multiple partitions may each be characterized in terms of how quickly state space has been symbolically covered in the partition, which may be measured in terms of partition processing cost. With this characterization of difficulty level, partitions may be scheduled for processing in ascending order of processing cost and state space may be explored in a manner that increases the rate at which new states are discovered. In a worst-case scenario, all the partitions may be processed and the entire state space may be traversed. This may occur, for example, in a circuit design containing no detectable errors.

One metric that may be used for assigning a scheduling cost for processing partitions is density-based scheduling. Large function representation sizes (i.e., BDD sizes) often create a significant bottleneck in symbolic verification techniques. When previous techniques are used, large BDD sizes often prohibits further state-space exploration. In contrast, when a partitioned approach is used, large BDD sizes trigger repartition, leading to an increase in the number of partitions to be explored. In a worst-case scenario, a drastic increase may be cause for abandoning exploration of that partition. Therefore, to achieve greater and faster state-space coverage, partitions with higher state density may be processed before partitions with lower state density. The density of a partition may be defined, in particular embodiments, as the ratio of the number of reachable states discovered in that partition to the size of the BDD representing the reachable states. This ratio may be used to measure how efficiently reachable states may be represented using a BDD. If this ratio is normalized with respect to size, partitions with a greater density may be considered easy and, accordingly, assigned a lower processing cost.

Another metric that may be used for assigning a scheduling cost for processing partitions is time-based scheduling, which takes into account the time used for the most recent fix point computation within each of the partitions, but may exclude the time used for communication either to or from the partition. If the partition is close to having been fully explored, there may be few image computations and, therefore, time used for communication either to or from the partition may be relatively small. However, generally speaking, the total time will be relatively small only if there is a significant number of image computations that are each associated with relative small time requirements. In such a case, image computation on the partition may be said to be easy, and the partition may be more amenable to symbolic manipulation as using one or more BDDs.

The ratio of the time taken for the most recent fixpoint computation to the density of the partition may be used as the cost function of the partition. The lower this cost, the earlier that partition should be scheduled for processing, which may effectively postpone traversal of states that are more expensive to discover. As an example and not by way of limitation, a reachability algorithm that includes scheduling may be described as follows:

```
Reachability(T, I) {
    R = Do Reachability from I using T until Blowup;
    Create partitioned rep for R
    Initialize Priority Queues in Scheduler S;
    do {
        Get LFPList from S.LFPQueue
        for each partition i in LFPList
            Calculate LeastFixedPoint in i and update S
        Get CommList from S.CommQueue
        for each partition i in CommList
            Communicate from i to all parts and update S
    } until (No new state is added to R);
}
```

The input to the reachability algorithm is a transition relation T and initial states I. The algorithm may run the standard monolithic algorithm for reachability on T and I until BDD size blowup is detected. Blowup may be defined according to the following parameters: (1) the ratio of BDD size during image computation to BDD size before image computation; and (2) an upper limit on BDD size. If the monolithic algorithm does not finish the reachability algorithm, POBDD-based reachability computation may be used. Partitions may be created using information from both R and T. The reachable state space R may then be converted to the POBDD data structure Pobdd-R. An important step in a POBDD-based state traversal algorithm is computing an LFP inside a partition. Another important step is to compute an image of a function in one or more other partitions (which includes communication from one partition to one or more other partitions). A scheduler may be used to select the partition to determine the next step in the operations described above. The scheduler may use two priority queues: one for each of the operations described above. Each partition may be assigned a cost that represents the relative cost of processing a partition. As described above, a cost metric may be used to compare two different partitions with each other. The scheduler may try to schedule easy partitions first. A getLFPList function may return top-half lowest-cost partitions from the LFP queue. Similarly, a getCommList function returns top-half lowest-cost partitions from the communication queue. This greedy approach attempts to reach a fixed point among lowest-cost partitions first, and the computation progresses toward processing higher-cost partitions and eventually completes a global fixed point computation.

In particular embodiments, a learning strategy may be used for property checking, which may provide flexibility in determining constants. A typical industrial design may have thousands of properties for formal verification. A designer may want to quickly verify all the properties. Formal verification tools often have many parameters, and it may be difficult to find a single setting that works for verification of all the properties. To address this problem, the following strategy may be used. A learning strategy is developed while running one or more experiments, and all properties are classified according to circuit size. This may result in a relatively small set of classes, with all properties inside one class behaving in one or more similar ways. Reducing the design with respect to class properties may result in similar circuits, so reachability computation may follow similar steps in the circuits. To take advantage of this, a best setting for each class is selected. In particular embodiments, any one or more of the following steps may be used:

(1) Design a candidate set. Three properties may be selected from each of the classes described above.

(2) Learn from the experiments of the candidate set. Apply different settings. A collection of good settings that work well with respect to easy properties, hard properties, and medium hard properties may be found for verifying properties in deep circuits, and all these settings may be applied to the candidate set. Learning may result from selecting a runtime and peak node count from all the experiments and selecting particular settings for each class of properties.

(3) Design a test set. Random properties may again be selected from each class and entered into the test set.

(4) Apply the previous learning experience to the test set. All good settings that were selected from the candidate set may be applied to the selected test set.

(5) Determine settings for each class. A best setting may be selected for each class from all the above experiments.

(6) Apply these settings to the respective class of properties more or less blindly.

In formal verification, if a setting works well, it works substantially better than another setting. A relatively significant amount of time may be spent determining a suitable setting, and this time may be amortized over the verification of a relatively large number of properties, which may reduce total time spent in verification. Although the learning strategy described above is described as being applied to a formal verification technique, the above learning strategy may be applied, in particular embodiments, to any suitable technique for verifying one or more properties of a circuit.

According to previous techniques, model checking has been performed by taking a circuit and determining the reachable state space of the circuit using image computation methods, such as a conjunction/quantification method. Properties are specified in terms of a logic language, such as computation tree logic (CTL). Then, on the reachable states calculated, the CTL properties are checked for detected violation, which may be accomplished by performing a reachability analysis in a backward direction. One drawback of these techniques is that it is often difficult to perform the reachability analysis in one or both directions.

In contrast, in particular embodiments, POBDDs are used. A POBDD technique divides the space into partitions and works within each partition as long as possible. When no further substantial progress can be made, partitions interact with each other. This interaction may be referred to as "communication." In particular embodiments, such communication may be an expensive operation and should, therefore, be done infrequently.

In particular embodiments, a scheme of communication-postponement is used for model checking, especially for formulas of the nature E(fug). In particular embodiments, an appropriate technique may be used to postpone communication among partitions. In particular embodiments, the use of dynamic partitioning in reachability, as well as in model checking, may create more partitions when blowup is detected. In particular embodiments, an appropriate technique may be used to decrease the number of partitions.

It is possible to express any CTL formula in terms of the Boolean connectives of propositional logic and the existential temporal operators EX, EU and EG. Such a representation is called the existential normal form.

Model Checking is usually performed in two stages. In the first stage, the finite state machine is reduced with respect to the formula being model checked and then the reachable states are computed. The second stage involves computing the set of states falsifying the given formula. The reachable states computed earlier are used as a care set in this step.

Since there are computational procedures for efficiently performing Boolean operations on symbolic BDD data structures, including POBDDs, model checking of CTL formulas is primarily concerned with the symbolic application of the temporal operators. EXq is a backward image and uses the same machinery as image computation during reachability, with the adjustment for the direction. EpUq (resp. EGp) has been traditionally represented as the least (resp. greatest) fixpoint of the operator $\tau(Z)=q \vee (p \wedge EXZ)$ (resp. $\tau(Z)=p \wedge EXZ$).

Invariants are CTL formulas of the form AGp, where p is a proposition, and can therefore be checked during the initial reachability computation itself.

Many previous reachability algorithms are based on a breadth-first traversal of finite-state machines. The algorithm takes as inputs the set of initial states, I(s), expressed in terms of the present state variables, s, and a transition relation, T(s,s',i), relating the set of next states, N(s'), that a system can reach from a state s on an input i. The translation relation, T(s,s',i), is obtained by taking a conjunction of the transition relations, $s_k'=f_k(s,i)$, of the individual state elements, i.e., $T(s,s',i)=\Pi(s_k'=f_k(s,i))$. Given a set of states, R(s), that the system can reach, the set of next states, N(s'), is calculated using the equation $N(s')=\exists_{s,i}[T(s,s',i) \vee R(s)]$. This calculation is also known as image computation. The set of reached states is computed by adding N(s) (obtained by replacing variables s' with s) to R(s) and iteratively performing the above image computation step until a fixed point is reached.

In the context of POBDDs, a transition relation, $T_{jk}$, may be derived from partition j into partition k by conjoining T with the respective window functions as $T_{jk}(s,s',i)=w_j(s)w_k(s')T(s,s',i)$. A PROBDD-based traversal algorithm uses the ROBDD-based algorithm in its inner loop to perform fixed point on individual partitions. Consider the partitioned-ROBDD representation $\chi_R=\{(w_j(s),R_j)|1\leq j\leq k\}$. If the image of $R_j$ under $T_{jj}$ is taken, $N_j(s')=\exists_{s,i}[w_j(s)w_j(s')T(s,s',i)R_j(s)]$ may be obtained. Since $w_j(s')$ is independent of the variables that are to be quantified, it can be taken out of existential quantification, yielding $N_j(s')=w_j(s')[\exists_{s,i}[w_j(s)T(s,s',i)R_j(s)]]$.

The image of $R_j$ under $T_{jj}$ lies completely within partition j. Similarly, the image, $N_l$ of $R_j$ under $T_{jl}$ will lie completely within partition l, and the image computation may be defined in terms of the image computed within the same partition and the image communicated to another partition. The former may be called ImgPart and the latter may be called as ImgComm. Analogously, the preImage computations prePart and preComm may be defined using the following pseudo-code:

```
preImgPart(Bdd, j) {
    return preImage(Bdd, T_jj)
}
preImgComm(S){
    result = φ
    for each (partition j)
```

-continued

```
        temp = preImage(S_j,T_jj)
        foreach (partitionk ≠ j)
            temp_k = temp restricted to w_k
            reorder BDD temp_k from partition order j to order k
            result_k =result_k ∨temp_k
        end for
    end for
    return result
}
```

The preImage (i.e. computeEX) may then be obtained by their union:

$$preImage(p): \bigvee_i preImgPart(p_i, i) \vee preImgComm(p)$$

Two approaches are possible for the computation of the communicated image: According to one approach, an image is computed from partition j into each partition k≠j, separately, using the transition relation $T_{jk}$. Alternatively, one can compute the image from partition j into the Boolean space that is the complement of partition j, denoted by $\bar{j}$. The former may be advantageous in that the BDD representations of the transition relations $T_{jk}$ are much smaller, but, in return, it has to perform $O(n^2)$ image computations. In particular embodiments, the second method is used to defining imgComm. This method requires only O(n) image computations, but each of these is followed by O(n) restrict operations.

The modalities EX, EU, and EG may suffice to represent any CTL formula in existential normal form. In particular, the deadlock property AG(p→EFq) can be represented in a greatest fixpoint free-fragment of CTL. Because invariant checking and deadlocks are often of practical interest to designers, particular embodiments address the least fixpoint operator E(pUq).

There are fundamental differences between the two image operations imgPart and imgComm. imgPart($R_j$) is in the same partition j as the original BDD $R_j$, and, therefore, only one partition needs to be in memory for its computation. On the other hand, imgComm($R_j$) computes an image into j' (i.e., every partition other than j), therefore it needs to finally access and modify every partition. This may give rise to two issues with respect to communication. First, the reached state set of every partition should be accessed. In the case of large designs, where the BDDs of even a single partition can run into millions of nodes, this usually means accessing stored partitions from the disk. Second, the BDD variable order of the computed image set should be changed from the order of the $j^{th}$ partition to that of each of its target partitions before the new states are added to the reached set in the target. For large designs, reordering a large BDD may be an expensive operation.

Image computation within a partition, ImgPart, is a relatively inexpensive operation in comparison with communication between partitions, ImgComm. Therefore, to reduce transfer of BDDs from one partition to another, an algorithm may be used to decrease the number of invocations of ImgComm, potentially whenever possible. An advantage of performing image computation repeatedly within a partition before communicating is that some errors may be caught earlier than they would otherwise caught. When a formula fails in any partition, it may be unnecessary to further explore the other partitions. In this manner, it may be possible to locate the error by exploring a smaller fraction of the state space than might otherwise be necessary.

As an example and not by way of limitation, an improved model checking algorithm designed to take advantage of partitioning is described below in the context of POBDDs:

```
compute EU(p, q) {
    S ← q and S.old ← φ
    repeat
        S.old ← S
        fore all (partitions j)
            repeat
                S_j.old ← S_j
                S_j ← S_j ∨(p_j ∧preImgPart(S_j, j))
            until(S_j = S_j.old)
        end for
        S ← S ∨(p ∧preImgComm(S))
    until(S = S.old)
    output S
}
```

In the computation of E(pUq), the preImage computation forms the bulk of the work performed by the algorithm. The cost of performing communication during every preimage is relatively large in terms of the resources required to transfer BDDs between partitions, to reorder the BDDs before such transfer can occur, and to fetch the partitions from storage in order that the new states can be conjuncted with p and disjuncted with q. Therefore, in particular embodiments, the call to preComm may be postponed to perform as many image computations as possible locally within each partition before communication is performed. The algorithm described above for computing the set E(pUq) may take advantage of the partitioned nature of the data structure. Each partition is explored independent of the other partitions until the other partitions individually reach a fix point. Then, communication across partitions may be performed. As a result, more than one partition need not be stored in memory at any given time and the number of communication-induced BDD transfers, disk accesses and variable reordering calls may be reduced.

In particular embodiments, a technique may be used to determine when a verification process should be stopped. Particular embodiments determine when semiformal verification has been performed to a suitable extent based on a number of states covered and a rate at which the states have been covered. The runtime of semiformal verification may be controlled based on whether a saturation point (or knee point) has been reached. One problem in semiformal verification is not knowing when the verification process should be stopped. Should more time be spent? Will the additional time provide additional meaningful coverage?

If a saturation point has been reached, even if more time is spent, it is unlikely that additional useful information will be obtained. If, on the other hand, a saturation point has not been reached, the verification process should probably be continued, especially with respect to the critical properties. For example, if many new states are being covered each second and no design bugs have been located, it may be desirable to continue the semiformal verification process. If, on the other hand, the program has slowed and is taking a disproportionate amount of time to cover new states (relative to earlier coverage), running the program longer (for example ten hours longer) may provide few (if any) benefits. In particular embodiments, covered state space is characterized such that the covered state space indicates whether all (or substantially all) easy states have already been covered and whether a saturation point seems to have been reached. In these embodiments, a fixed timeout need not be used.

Covered state space may be plotted with respect to reachability calculation steps. Verification may be performed using one or more reachability calculations, and each step of these calculations may reach a state that farther from an initial state of the design. As an example, at the end of reachability calculation step number 10, states that are a distance of at least ten from the initial state will have been reached. A curve may be fitted through the plot that captures, on the Y axis, a number of states covered and, on the X axis, a number of reachability calculation steps. The curve may then be analyzed. If the curve displays a knee, the knee represents a saturation point. Any suitable curve-plotting software may be used. In particular embodiments, a knee point may or may not be reached. Reference to a knee point encompasses a point along a curve at which the curve almost stops increasing with respect to the Y axis and becomes at least somewhat flat. In particular embodiments, a technique for locating potential saturation points may be used as follows: if a verification process has not yet reached a saturation point with respect to each property (in a semiformal mode), the verification process should be continued. Otherwise, the verification process should be stopped.

Figure 5:
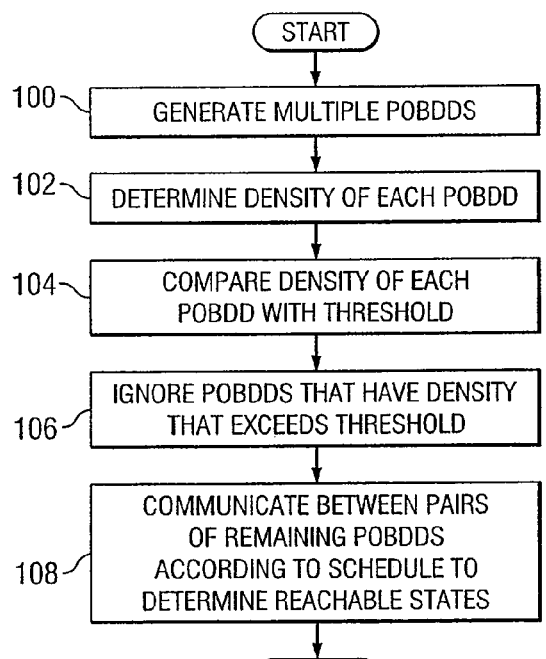
FIG. 5 illustrates an example method for semiformal verification of a circuit using a scheduling technique.

FIG. 5 illustrates an example method for semiformal verification of a circuit using a scheduling technique. The method begins at step 100, where multiple POBDDs are generated that each correspond to a partition of a state space of the circuit. The POBDDs each include a number of states and a number of nodes, as described above. At step 102, a density of each POBDD is determined. As described above, a density of a POBDD reflects a number of states and a number of nodes in the POBDD. At step 104, if a POBDD has a density that exceeds a threshold (which may be predetermined), the POBDD is ignored. At step 106, pairs of POBDDs that have not been ignored communicate with each other according a schedule to determine one or more reachable states of the circuit, at which point the method ends. As an example and not by way of limitation, in particular embodiments, according to the schedule, communication from higher-density, easier partitions to lower-density, easier partitions are a first priority; communication from higher-density, easier partitions to higher-density easier partitions are a second priority; and communication from higher-density, easier partitions to lower-density, more difficult partitions are a third priority. Although particular steps of the method illustrated in FIG. 5 are described and illustrated as occurring in a particular order, the present invention contemplates any suitable steps of the method described above occurring in any suitable order.

Although the present invention has been described in detail with reference to particular embodiments, system 10 may be extended to any scenario in which verification is sought for a given target that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as BMC tool element 20, POBDD data structure 14, and algorithm element 16, these elements may be provided in a single integral unit where appropriate or replaced with devices that effectuate their functions. POBDD data structure 14 may be used with any other suitable checking or simulation protocol in order to enhance the verification capabilities thereof. Additionally, designer information 24 may be communicated or otherwise offered to POBDD data structure 14 in any appropriate manner such that BMC tool element 20 is provided with enhanced starting points for executing bounded model checking.

In addition, although system 10 has been described with reference to one or more discreet components, additional intermediate components may be provided to system 10 in order to facilitate the processing operations thereof. For example, additional components may be used in the communication of information between BMC tool element 20 and POBDD data structure 14. The present invention enjoys considerable versatility in that these components may be capable of operating in conjunction with various intermediate processing elements, in any suitable fashion, that facilitate the verification procedure for a given target element or object.

Although the present invention has been described with several embodiments, sundry changes, substitutions, variations, alterations, and modifications may be suggested to one skilled in the art, and it is intended that the invention may encompass all such changes, substitutions, variations, alterations, and modifications falling within the spirit and scope of the appended claims. The present invention is not limited, in any way, by any statement in the specification that is not reflected in the appended claims.

What is claimed is:

1. A method for verifying a circuit, the method comprising:
   generating by one or more computing systems, one or more partitions of a state space of a circuit, each partition being associated with a representation that has a size;
   initiating processing of each of the generated partitions using the representations of the generated partitions to verify the circuit;
   if, during the processing of the partition, the size of one of the representations of one of the generated partitions exceeds a first threshold:
      determining at least one splitting variable usable to generate two or more subpartitions from the partition, the splitting variable being determined according to a cost function;
      generating two or more subpartitions from the partition using the determined splitting variable, each of the subpartitions also being associated with a representation that has a size;
      initiating processing of each of the two or more subpartitions; and
      if, during processing of each of the subpartitions, the size of the representation of the subpartition exceeds a second threshold, generating further subpartitions from the subpartition to limit partition-representation size.

2. The method of claim 1, wherein, to verify the circuit, a formal verification technique or a semiformal verification technique is used.

3. A method for verification of a circuit, the method comprising:
   initiating by one or more computing systems, a first circuit verification process to verify a circuit, the verification process using a nonpartitioned ordered binary decision diagram (OBDD) having a size; and
   if, during the first circuit verification process, the size of the nonpartitioned OBDD exceeds a threshold:
      terminating the first circuit verification process;
      selecting, according to a splitting variable heuristics technique, one or more splitting variables for generating two or more partitioned OBDDs (POBDDs);
      using the nonpartitioned OBDD and the one or more selected splitting variables, generating two or more POBDDs that each correspond to a particular state space of the circuit; and
      initiating a second circuit verification process to verify the circuit, the verification process using the two or more generated POBDDs.

4. The method of claim 3 wherein the first and second circuit verification processes comprise formal verification processes or semiformal verification processes.

* * * * *

UNITED STATES PATENT AND TRADEMARK OFFICE
CERTIFICATE OF CORRECTION

PATENT NO. : 7,571,403 B2  Page 1 of 1
APPLICATION NO. : 11/279177
DATED : August 4, 2009
INVENTOR(S) : Jain et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 285 days.

Signed and Sealed this

Seventh Day of September, 2010

David J. Kappos
*Director of the United States Patent and Trademark Office*